United States Patent [19]

Amerasekera et al.

[11] Patent Number: 5,539,233
[45] Date of Patent: Jul. 23, 1996

[54] CONTROLLED LOW COLLECTOR BREAKDOWN VOLTAGE VERTICAL TRANSISTOR FOR ESD PROTECTION CIRCUITS

[75] Inventors: Ajith Amerasekera; Amitava Chatterjee, both of Plano, Tex.

[73] Assignee: Texas Instruments Incorporated, Dallas, Tex.

[21] Appl. No.: 489,704

[22] Filed: Jun. 13, 1995

Related U.S. Application Data

[63] Continuation of Ser. No. 275,926, Jul. 15, 1994, abandoned, which is a continuation of Ser. No. 96,073, Jul. 22, 1993, abandoned.

[51] Int. Cl.$^6$ .......................... H01L 23/62; H01L 27/082
[52] U.S. Cl. .......................... 257/362; 257/360; 257/583; 257/589; 257/592
[58] Field of Search .......................... 257/358, 359, 257/360, 361, 362, 363, 583, 589, 592

[56] References Cited

U.S. PATENT DOCUMENTS

| | | | |
|---|---|---|---|
| 3,823,353 | 7/1974 | Berger et al. ........................ | 257/555 |
| 3,952,325 | 4/1976 | Beale et al. . | |
| 4,075,039 | 2/1978 | Sloan, Jr. ............................ | 297/564 |
| 4,137,109 | 1/1979 | Aiken et al. ......................... | 148/175 |
| 4,259,680 | 3/1981 | Lepselter et al. ................... | 257/592 |
| 4,617,071 | 10/1986 | Vora . | |
| 4,622,575 | 11/1986 | Vora et al. . | |
| 4,760,433 | 7/1988 | Young et al. ........................ | 257/362 |
| 4,881,111 | 11/1989 | Sanders . | |
| 4,882,706 | 11/1989 | Sinclair . | |

FOREIGN PATENT DOCUMENTS

| | | | |
|---|---|---|---|
| 55-165682 | 12/1980 | Japan ................................... | 257/362 |
| 61-23353 | 1/1986 | Japan ................................... | 257/362 |
| 61-73363 | 4/1986 | Japan ................................... | 257/362 |
| 61-214458 | 9/1986 | Japan ................................... | 257/565 |
| 63-202056 | 8/1988 | Japan ................................... | 257/360 |
| 3-165059 | 11/1989 | Japan . | |
| 3-165059 | 7/1991 | Japan ................................... | 257/360 |

OTHER PUBLICATIONS

Sze, S. M., Physics of Semiconductor Devices, John Wiley & Sons, 1982, p. 149.
Chen, K., "The Effects of Interconnect Process and Snapback Voltage on the ESD Failure Threshold of NMOS Transistors," IEEE Transactions on Electron Devices, vol. 35, No. 12, Dec. 1988, pp. 2140–2148.
Muller, et al. Device Electronics for Integrated Circuits. John Wiley & Sons, 1986, pp. 494–495.
Chaine, et al., "ESD Improvement Using Low Concentrations of Arsenic Implantation in CMOS Output Buffers," EOS/ESD Symposium 92-136, pp. 4.2.1–4.2.7.
Krakauer, et al. "ESD Protection in a 3.3V Sub-Micron Silicided CMOS Technology" EOS/ESD Symposium 92-250, pp. 5B.4.1–5B.4.2.
Sze, S. M., Physics of Semiconductor Devices, John Wiley & Sons, 1982, p. 101.
Ghandhi, Semiconductor Power Devices, John Wiley & Sons, 1977, pp. 44–45.

Primary Examiner—Ngan V. Ngo
Attorney, Agent, or Firm—Kay Houston; James Brady; Richard Donaldson

[57] ABSTRACT

An npn transistor having a low collector-base breakdown voltage. An emitter region (104, 106) of a first conductivity type is located in a semiconductor substrate (102). A base region (14) of a second conductivity type is located within the emitter region (104,106) and a shallow collector region (18) of the first conductivity type is located within the base region (14). The shallow collector region (18) may be doped with arsenic and/or phosphorus such that the dopant concentration and depth of the shallow collector region (18) provide a low collector-base breakdown voltage.

15 Claims, 3 Drawing Sheets

CONTROLLED LOW COLLECTOR BREAKDOWN VOLTAGE VERTICAL TRANSISTOR FOR ESD PROTECTION CIRCUITS

This application is a continuation of application Ser. No. 08/275,926, filed Jul. 15, 1994, now abandoned, which is a continuation of Ser. No. 08/096,073, filed Jul. 22, 1993, now abandoned.

FIELD OF THE INVENTION

The present invention relates generally to integrated circuits, and more specifically to methods and apparatus for electrostatic discharge protection for integrated circuits.

BACKGROUND OF THE INVENTION

Electrostatic discharge (ESD) may cause damage to semiconductor devices on an integrated circuit during handling of the integrated circuit chip package. Prevention of such damage generally is provided by protection circuits incorporated into the chip of the integrated circuit. In general, such protection circuits include a switch which is capable of conducting relatively large currents during an ESD event. Various devices such as a Silicon Controlled Rectifier (SCR) can be utilized to provide the switching function required to essentially shunt the protected circuitry during an ESD event.

Previous circuits and structures used for ESD protection can withstand high levels of ESD stress. However, recent advances in technology have produced devices which can fail at voltage levels lower than the triggering voltages of prior art protection circuits. Accordingly, a need has developed for improved ESD protection circuits. Similarly, the increased usage of BiCMOS technology in integrated circuitry has created a need for ESD protection in these circuits as well. There is also a need to reduce the complexity and size of the ESD protection circuit.

SUMMARY

An npn transistor having a low collector-base breakdown voltage is disclosed. An emitter region of a first conductivity type is located in a semiconductor substrate. A base region of a second conductivity type is located within the emitter region and a shallow collector region of the first conductivity type is located within the base region. The shallow collector region may be doped with arsenic and/or phosphorus such that the dopant concentration and depth of the shallow collector region provide a low collector-base breakdown voltage.

An advantage of the invention is providing an ESD protection circuit having a low triggering voltage.

Another advantage of the invention is providing a npn transistor having a low open circuit collector-base breakdown voltage.

These and other advantages will be apparent to those skilled in the art having reference to this specification in conjunction with the drawings.

BRIEF DESCRIPTION OF DRAWINGS

In the drawings.

Corresponding numerals and symbols in the different figures refer to corresponding parts unless otherwise indicated.

DETAILED DESCRIPTION OF THE INVENTION

The preferred embodiment of the invention is described in conjunction with an npn transistor designed to be used for ESD. It is directly applicable to ESD protection circuits in BiCMOS or bipolar technologies.

Prior art bipolar protection circuits typically utilize either SCR's with a decoupling resistor to isolate them from the circuit to be protected, or have additional circuit elements to reduce the trigger voltage of the npn primary protection device by providing the required base current to turn on the npn transistor. These elements increase the complexity of the protected circuit as well as adding extra circuit elements which load the I/O pins.

The collector-base breakdown of standard npn transistors is insufficient for ESD protection circuits for bipolar/BiCMOS technologies because the high open circuit collector base breakdown voltage, BVcbo, of standard devices is greater than the breakdown voltages of the MOS drains and the emitter-base npn junctions. A protection circuit element which has a high ESD threshold, and a low BVcbo is needed. The standard npn bipolar transistor has a high ESD threshold, but the BVcbo voltage needs to be reduced to protect MOS devices used in input buffers in BiCMOS technologies.

Figure 1:
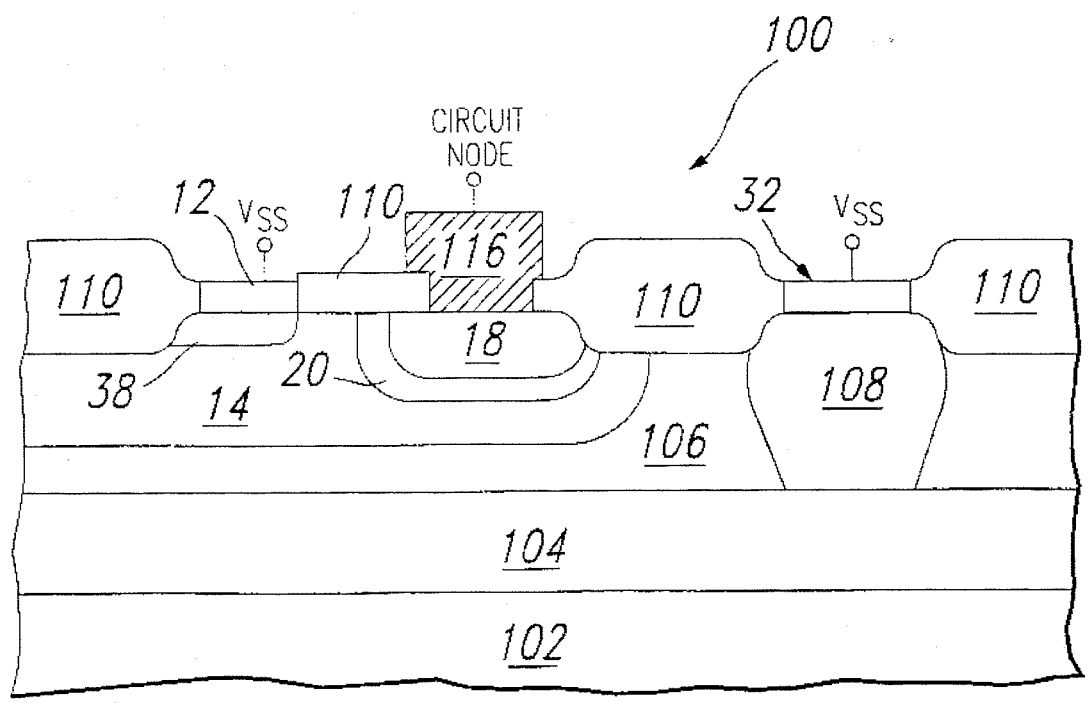
FIG. 1—A cross-sectional view of a npn transistor according to the preferred embodiment of the invention.

FIG. 1 is a cross-sectional view of a npn transistor according to the invention. Semiconductor device 100 has an emitter region consisting of buried n+ layer 104 and n-well 106 formed in substrate 102. In the preferred embodiment, substrate 102 is p-type. However, it will be apparent to those skilled in the art that a n-type substrate may alternatively be used. The emitter region may be electrically connected to Vss (ground) through emitter contact 32 and n+ region 108. Base region 12 is located in n-well 106. In the preferred embodiment base region 12 is p-type. Base region 12 may be electrically connected to Vss (ground) through p+ region 38 and base contact 12. Collector region 18 is shown as n-type and formed in n-type region 20. Collector region 18 may be electrically connected to a circuit node to be protected through collector contact 116. Field insulating regions 110 are located at the surface of device 100 and isolate the base contact 12, collector contact 116 and emitter contact 32 from each other. It should be noted that the shallow n-type region normally used to form an emitter region in standard bipolar technologies actually forms collector region 18. This reduces the open collector/base breakdown voltage (BVcbo) from approximately 18 V to approximately 4.5 V.

In operation, the junction formed by the n regions 18 and 20, and the p-base region 14 begins avalanching during an ESD event, injecting holes into the p-base region 14. The hole current increases the voltage at the junction between n-well 106 and p-base region 14 until it is eventually forward biased. When the junction between the n-well 106 and the p-base region 14 forward biases, the transistor turns on and the device is in a low voltage, high current mode, which is ideal for ESD protection. BVcbo is a function of the collector 18 doping concentration and may be decreased by increasing the arsenic dose, or increased by reducing the arsenic dose. Addition of phosphorus into the collector 18 increases the breakdown voltage.

Figure 2:
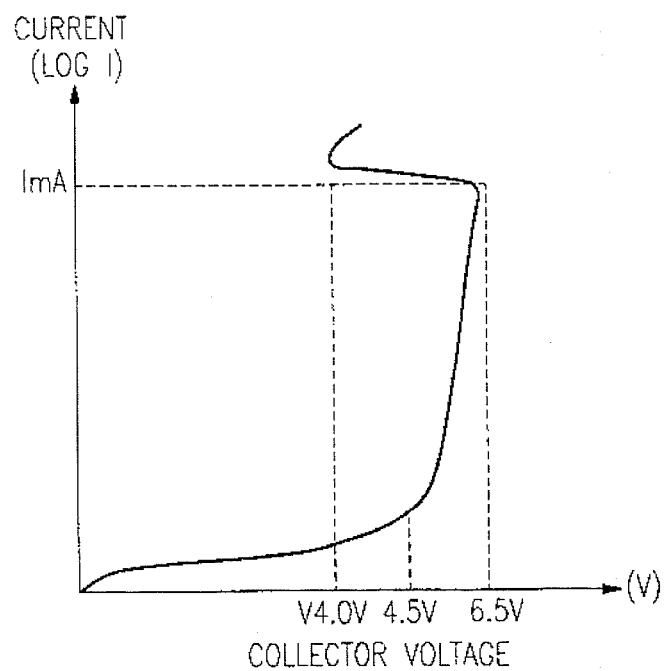
FIG. 2—An I-V curve showing collector current vs. collector voltage of the npn transistor of FIG. 1.

FIG. 2 is an I-V curve of the collector current vs. collector voltage of the npn transistor of FIG. 1 with the emitter and base at ground. As the current is increased, the collector-base breakdown occurs at approximately 4.5 v. Holes are then injected into the base to provide the base current required to turn the npn transistor on at approximately 1 ma, and the voltage drops to approximately 4 v. At the turn-on voltage (approx. 6.5 V), the npn transistor goes from a high impedance state into a low impedance state. The current axis is shown in log scale, and the voltage axis in linear scale. The characteristics discussed above are sufficient to provide good protection in 3.3 v technologies by clamping the voltage to less than the breakdown voltage of the device being protected. ESD levels of 15 v/um have been obtained. Hence a 200 um wide device can provide 3000 v of ESD protection. The BVcbo voltage can be changed by varying the collector doping, either by using a phosphorous implant instead of the arsenic implant, or by implanting phosphorus after the arsenic implant. This way the BVcbo can be increased to accommodate 5 v circuits, as well as to reduce leakage current in the protection circuit.

Figure 3:
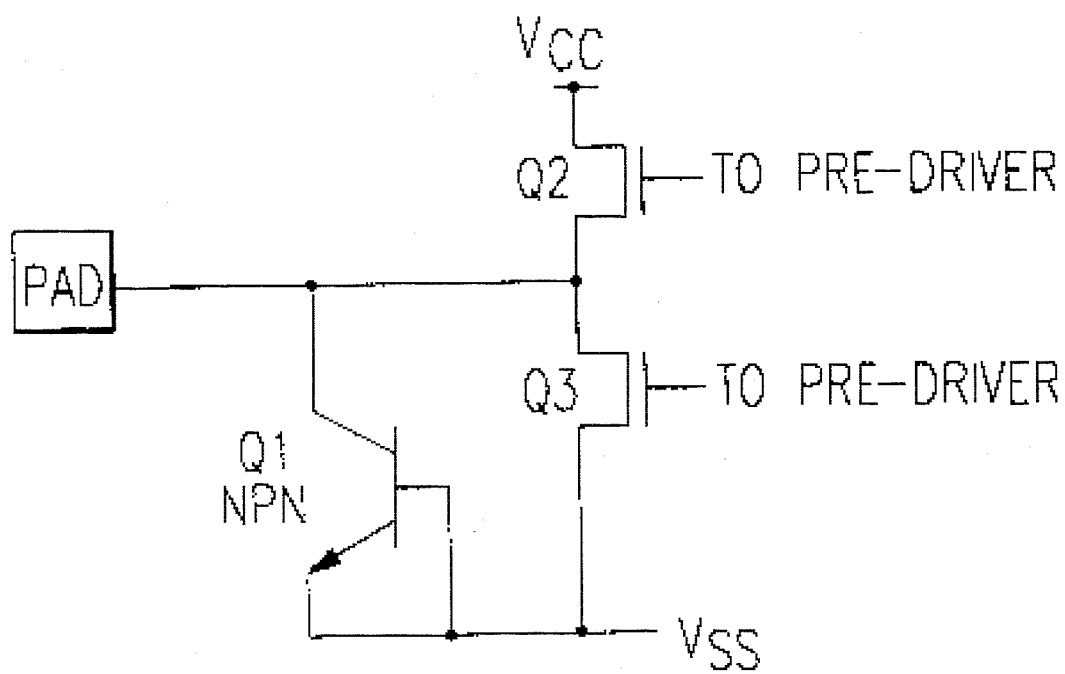
FIG. 3—A schematic diagram of a circuit utilizing the npn transistor of FIG. 1.

FIG. 3 shows an application of the preferred embodiment of the invention. Q1 is the low collector-base breakdown voltage npn transistor described above. Q2 is the n-channel MOS transistor, in the integrated circuit, which is required to be protected during an ESD event. Q3 is the p-channel MOS transistor, also in the integrated circuit, which is required to be protected during an ESD event. The gates of Q2 and Q3 are connected to internal circuitry in the chips, known as the pre-drivers. During an ESD event, the voltage at the pad is clamped at a level below that required to cause damage to Q2 or Q3, by the low voltage collector-base breakdown of Q1. Once Q1 turns on, all the ESD current flows in Q1.

The advantage of this protection is that simple circuits utilizing single npn transistors can be used to provide high levels of ESD protection in advanced submicron BiCMOS and bipolar circuits.

Figure 4:
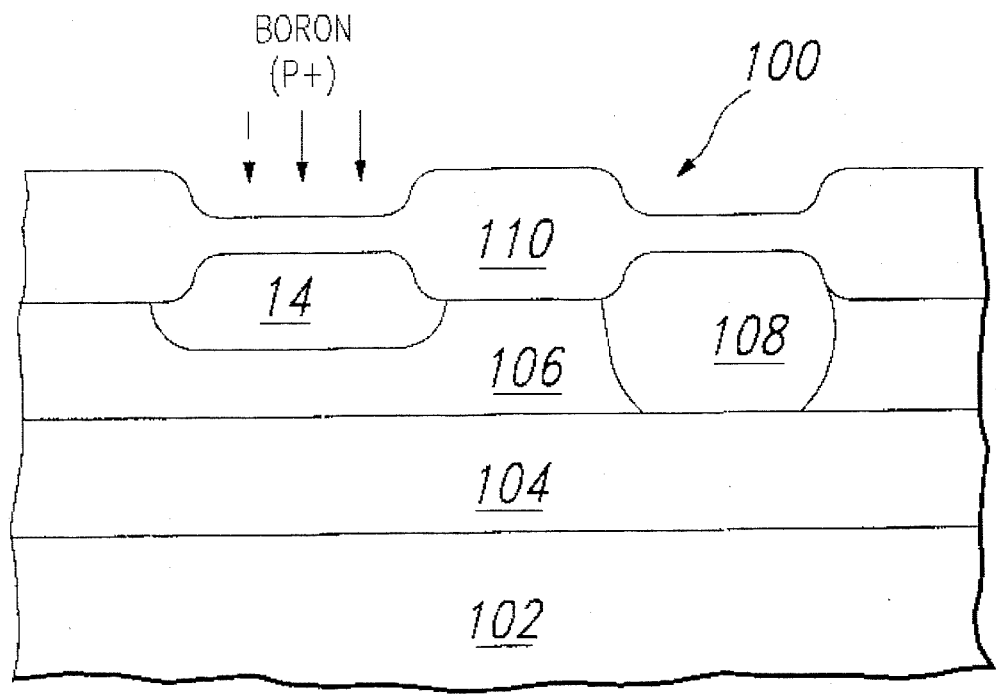
FIG. 4 & 5—Cross-sectional views of the preferred embodiment of the invention at various stages of fabrication.
Figure 5:
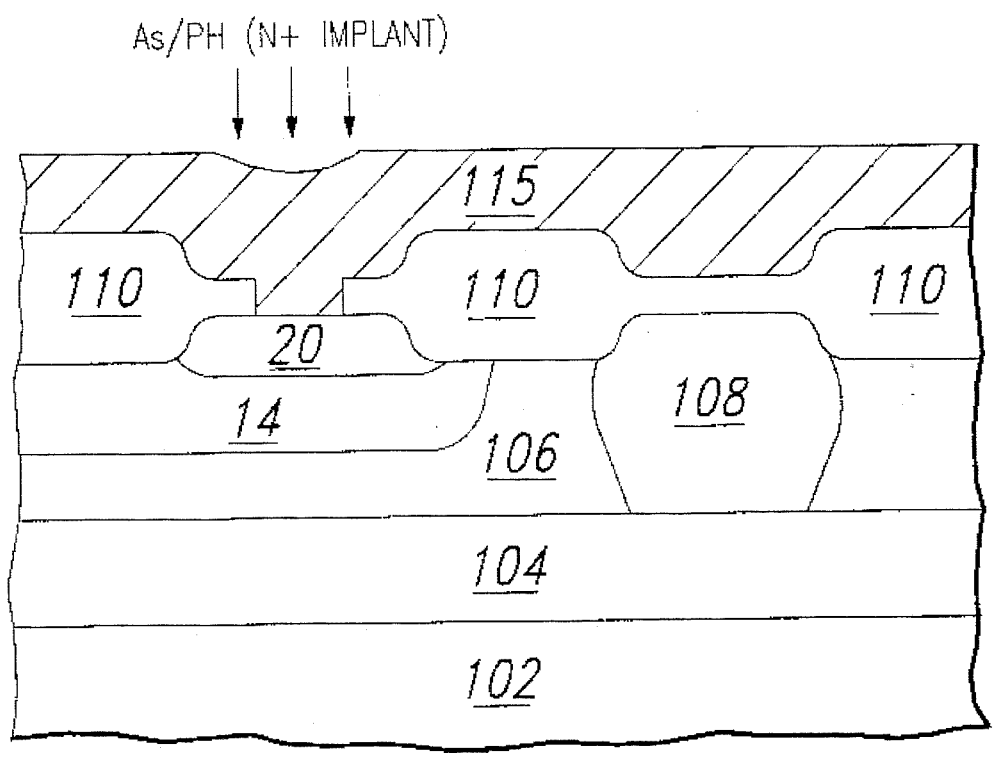

The fabrication of the npn transistor shown in FIG. 1 will now be discussed. FIG. 4 shows semiconductor device 100 after the formation of buried n+ layer 104, a n-well region 106, deep n+ region 108, and field insulating regions 110 in the substrate 102. Methods for forming the buried layers 104, 106, and 108 are described in U.S. Pat. No. 4,958,213, issued Sep. 18, 1990 and assigned to Texas Instruments Incorporated. A method for forming field insulating regions 110 is described in U.S. Pat. No. 4,541,167, issued Sep. 17, 1985 and assigned to Texas Instruments Incorporated. After formation of the n-well region 106, the p-base region 14 is formed by boron implant. Referring to FIG. 5, a layer of conductive material, such as polysilicon layer 115, is deposited over the surface of the structure. The n-type region 20 may be implanted with arsenic. The n-type region 20 may additionally be implanted with phosphorous. After the formation of n-type region 20, polysilicon layer 115 is patterned and etched to form the collector contact 116. The n+ region 18 is then formed by implanting an n-type dopant such as arsenic through the collector contact 116. The arsenic or phosphorus have implant doses on the order of 1E15/cm2 and 1E14/cm2 respectively. Alternatively, two phosphorus implants may be used with doses of 1E15/cm2 and 1E14/cm2. Regions 18 and 20 may alternatively be formed prior to the deposition of polysilicon layer 115 using an implantation of phosphorus. The p+ layer 38 is formed by implanting boron after the n+ arsenic region 18 and the n– phosphorus region 20 are implanted. Finally, base contact 12 and emitter contact 32 are formed by conventional techniques. FIG. 1 shows the final transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that appended claims encompass any such modifications or embodiments.

What is claimed is:

1. A vertical npn transistor having a low collector-base breakdown voltage comprising:

A. an emitter region of a first conductivity type located in a semiconductor substrate;

B. a base region of a second conductivity type located within said emitter region, said base region connected to a ground; and C. a shallow collector region of said first conductivity type located within said base region, said shallow collector region connected to a circuit node, said shallow collector region having a dopant concentration level such that said shallow collector region provides a collector-base breakdown voltage of less than 8 volts.

2. The vertical npn transistor of claim 1 wherein said first conductivity type is n-type.

3. The vertical npn transistor of claim 1 wherein said shallow collector region comprises arsenic.

4. The vertical npn transistor of claim 1 wherein said shallow collector region comprises arsenic and phosphorous.

5. The vertical npn transistor of claim 1, wherein said emitter region is connected to said ground.

6. An ESD protection device for protecting integrated circuitry, comprising a vertical bipolar transistor having a collector-base breakdown voltage of less than 8 volts, wherein said bipolar transistor comprises a collector connected to said integrated circuitry, an emitter connected to a ground, and a base region connected to said ground, wherein said collector comprises a shallow region of a first conductivity type at a surface of a semiconductor body.

7. The ESD protection device of claim 6, wherein:

a. said emitter comprises an emitter region of a first conductivity type;

b. said base comprises a base region of a second conductivity type located within said emitter region; and c. said collector comprises a shallow collector region of said first conductivity type located within said base region.

8. The ESD protection device of claim 7, wherein said first conductivity type is n-type.

9. The ESD protection device of claim 7, wherein said shallow collector region comprises arsenic.

10. The ESD protection device of claim 7, wherein said shallow collector region comprises arsenic and phosphorous.

11. The ESD protection device of claim 6 wherein said integrated circuitry comprises MOS technology.

12. The vertical npn transistor of claim 1 wherein said circuit node is connected to an integrated circuitry, wherein said integrated circuitry comprises MOS technology.

13. The vertical npn transistor of claim 1 wherein said shallow collector region is an n+ region.

14. The ESD protection device of claim 6 wherein said collector-base breakdown voltage is about 4.5 volts.

15. The vertical npn transistor of claim 1 wherein said collector-base breakdown voltage is about 4.5 volts.

* * * * *